US008641381B2

(12) United States Patent
King et al.

(10) Patent No.: US 8,641,381 B2
(45) Date of Patent: Feb. 4, 2014

(54) SYSTEM AND METHOD FOR REDUCING GRAIN BOUNDARIES IN SHROUDED AIRFOILS

(75) Inventors: Warren Tan King, Mauldin, SC (US); Srikanth Chandrudu Kottilingam, Simpsonville, SC (US); Arthur Samuel Peck, Greenville, SC (US)

(73) Assignee: General Electric Company, Schenectady, NY (US)

( * ) Notice: Subject to any disclaimer, the term of this patent is extended or adjusted under 35 U.S.C. 154(b) by 966 days.

(21) Appl. No.: 12/760,089

(22) Filed: Apr. 14, 2010

(65) Prior Publication Data

US 2011/0255984 A1 Oct. 20, 2011

(51) Int. Cl.
*F01D 5/22* (2006.01)
*F01D 5/28* (2006.01)

(52) U.S. Cl.
USPC ......... 416/190; 416/191; 416/192; 416/241 R

(58) Field of Classification Search
USPC ...................... 415/173.4, 173.5, 173.6, 200; 416/189–192, 193 R, 193 A, 241 R, 500
See application file for complete search history.

(56) References Cited

U.S. PATENT DOCUMENTS

| | | | |
|---|---|---|---|
| 3,494,709 A * | 2/1970 | Piearcey | 416/232 |
| 3,536,121 A | 10/1970 | Piearcey | |
| 3,690,368 A | 9/1972 | Copley | |
| 3,752,221 A | 8/1973 | Copley | |
| 3,908,733 A | 9/1975 | Brazer et al. | |
| 4,108,672 A | 8/1978 | Klug et al. | |
| 4,180,119 A | 12/1979 | Burd et al. | |
| 4,549,599 A | 10/1985 | Reiner et al. | |
| 5,404,930 A | 4/1995 | Stanton et al. | |
| 5,611,389 A | 3/1997 | Alessandri | |
| 6,164,916 A | 12/2000 | Frost et al. | |
| 6,857,853 B1 | 2/2005 | Tomberg et al. | |
| 6,969,240 B2 * | 11/2005 | Strangman | 416/234 |
| 7,334,993 B2 * | 2/2008 | Sekihara et al. | 416/97 R |
| 2008/0099177 A1 | 5/2008 | Graham et al. | |
| 2010/0025382 A1 | 2/2010 | Kottilingam et al. | |
| 2010/0043929 A1 * | 2/2010 | Hobbs et al. | 148/714 |
| 2010/0071812 A1 | 3/2010 | Schaeffer | |

FOREIGN PATENT DOCUMENTS

| | | |
|---|---|---|
| EP | 2151292 A1 | 2/2010 |
| GB | 1281798 A | 7/1972 |
| GB | 2030233 A | 4/1980 |

OTHER PUBLICATIONS

Search Report and Written Opinion from corresponding EP Application No. 11162105.8-2321 dated Jul. 13, 2011.

* cited by examiner

*Primary Examiner* — Christopher Verdier
(74) *Attorney, Agent, or Firm* — Dority & Manning, PA

(57) ABSTRACT

A turbine bucket includes an airfoil and a shroud. The shroud includes first and second bearing surfaces, and the first and second bearing surfaces each comprise a single grain structure. A method for forming a turbine bucket includes orienting a mold vertically, wherein the mold includes a first portion that defines a shank, a second portion connected to the first portion that defines an airfoil, and a third portion connected to the second portion that defines a shroud, wherein the third portion includes first and second sides, and wherein the first portion is higher than the second portion and the second portion is higher than the third portion. The method further includes flowing a molten metal into the mold and selectively growing large single grains in at least one of the first or second sides.

8 Claims, 4 Drawing Sheets

SYSTEM AND METHOD FOR REDUCING GRAIN BOUNDARIES IN SHROUDED AIRFOILS

FIELD OF THE INVENTION

The present invention generally involves gas turbine components made from super alloy castings. In particular, the present invention describes and enables a turbine blade shroud with a localized single grain structure and a method for manufacturing such a turbine blade shroud.

BACKGROUND OF THE INVENTION

Turbines generally include multiple stages of rotating blades, also known as turbine buckets, circumferentially located around a rotor. Each turbine bucket generally includes a root portion that connects to the rotor, an airfoil portion that extends radially from the root portion, and a shroud portion that connects to the airfoil portion at the outer radial end of the turbine bucket. A working fluid flowing through the turbine causes the turbine buckets and rotor to rotate to produce work. A bearing surface on each side of the shroud portion allows adjacent turbine buckets to interlock at the outer radial extremity. This radial interlocking of turbine buckets prevents the turbine buckets from vibrating, thereby reducing the stresses imparted on the turbine buckets during operation.

Turbine buckets are often cast from molten metal, and directionally solidified turbine bucket castings are commonly used to improve the efficiency and performance of turbine buckets beyond that previously available with conventional castings. In directional solidification castings, molten metal is supplied to a vertically oriented turbine bucket mold having a cavity for the root, airfoil, and shroud portions of the turbine bucket. A chill plate located at the lower end of the mold, for example adjacent to the root portion of the mold, rapidly removes heat and creates a vertical temperature gradient along the mold. The vertical temperature gradient promotes the growth of directionally solidified grains normal to the chill plate from the root portion, through the airfoil portion, and ending at the shroud portion. However, angles, curves, indentations, and other changes in the mold shape alter the direction of the grain growth, resulting in the development of multiple directionally solidified grains as the molten metal cools. The multiple directionally solidified grains converge at the vertically highest portion of the mold, for example the shroud portion of the turbine bucket. The convergence of the multiple directionally solidified grains results in multiple grain boundaries in the shroud portion of the turbine bucket.

The multiple grain boundaries in the shroud portion of the turbine bucket are characterized by high interfacial energy, a relatively weak bond, and a susceptible fracture path. As a result, the shroud portion may be more susceptible to an earlier onset of corrosion, creep, fatigue failure, cracking, and other failure mechanisms. This may be of particular concern at the bearing surfaces of the shroud portion that experience additional stress and fatigue cycles during normal operations. Therefore, a system and method for reducing grain boundaries in the shroud portion of turbine buckets may be useful.

BRIEF DESCRIPTION OF THE INVENTION

Aspects and advantages of the invention are set forth below in the following description, or may be obvious from the description, or may be learned through practice of the invention.

One embodiment of the present invention is a turbine bucket. The turbine bucket includes an airfoil and a shroud at one end of the airfoil. The shroud includes a first bearing surface and a second bearing surface, and the first and second bearing surfaces each comprise a single grain structure.

Another embodiment of the present invention is a system for casting a directionally solidified turbine bucket. The system includes a mold having a first portion at a first end that defines a shank for the turbine bucket, a second portion connected to the first portion that defines an airfoil for the turbine bucket, and a third portion connected to the second portion at a second end that defines a shroud for the turbine bucket. The third portion includes a first side and a second side, and a single crystal selector is connected to at least one of the first side or the second side of the third portion.

A still further embodiment of the present invention is a method for forming a directionally solidified turbine bucket. The method includes orienting a mold vertically, wherein the mold includes a first portion that defines a shank for the turbine bucket, a second portion connected to the first portion that defines an airfoil for the turbine bucket, and a third portion connected to the second portion that defines a shroud for the turbine bucket, wherein the third portion includes a first side and a second side, and wherein the first portion is higher than the second portion and the second portion is higher than the third portion. The method further includes flowing a molten metal into the mold and selectively growing large single grains in at least one of the first side or second side of the third portion.

Those of ordinary skill in the art will better appreciate the features and aspects of such embodiments, and others, upon review of the specification.

BRIEF DESCRIPTION OF THE DRAWINGS

A full and enabling disclosure of the present invention, including the best mode thereof to one skilled in the art, is set forth more particularly in the remainder of the specification, including reference to the accompanying Figures, in which.

DETAILED DESCRIPTION OF THE INVENTION

Figure 1:
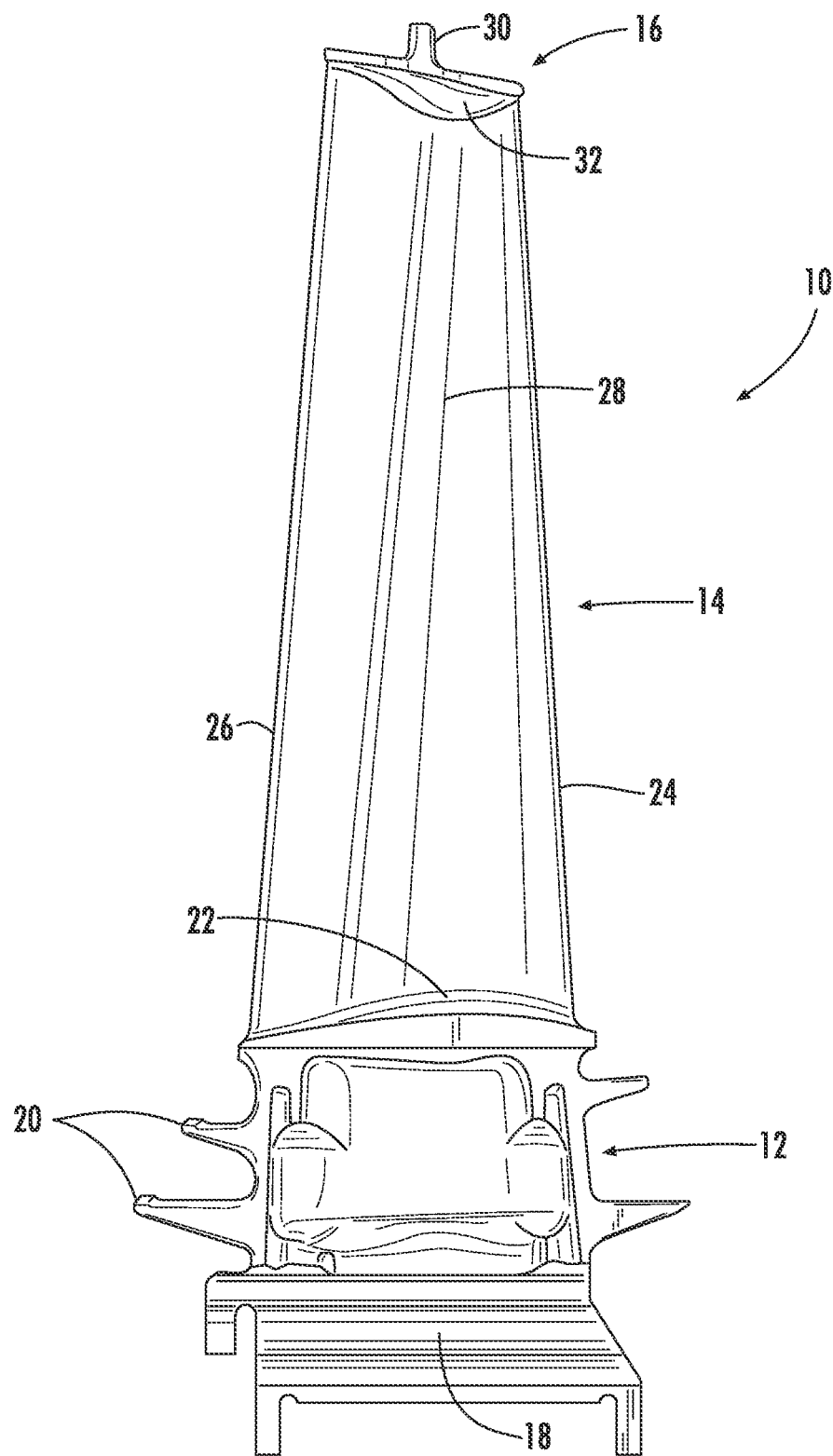
FIG. 1 is a side view of a turbine bucket according to one embodiment of the present invention.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention.

Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

FIG. 1 provides a side view of a turbine bucket 10 according to one embodiment of the present invention. As shown, the turbine bucket 10 generally includes a shank 12, an airfoil 14, and a shroud 16. The shank 12 may include a dovetail 18 or other shape for connecting the turbine bucket 10 to a rotor (not shown). The shank 12 may further include one or more angel wings 20 that extend from the shank 12 to restrict the flow of combustion gases from bypassing the turbine bucket 10. The shank 12 connects to the airfoil 14 at a root 22 of the airfoil 14. As is known in the art, the airfoil 14 has a leading edge 24 and a trailing edge 26. A generally concave pressure surface and a generally convex suction surface 28 extend between the leading and trailing edges 24, 26 on opposite sides of the airfoil 14. The shroud 16 connects to the airfoil 14 at the outer radial end of the airfoil 14.

Figure 2:
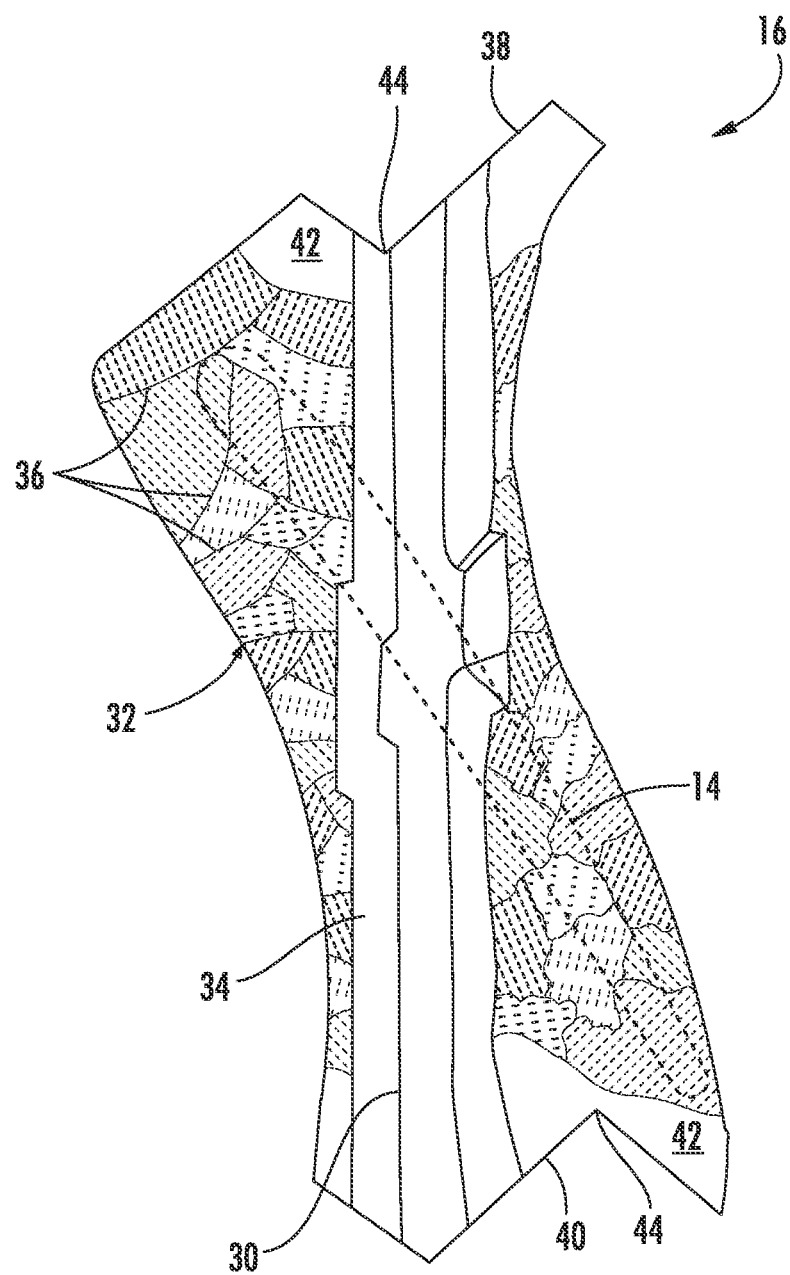
FIG. 2 is a top plan view of the turbine bucket shown in FIG. 1.

FIG. 2 shows a top plan view of the turbine bucket 10 shown in FIG. 1 to more clearly illustrate specific aspects and features of the shroud 16. The outline of the airfoil 14 is shown in dashed lines to provide orientation. The shroud 16 generally includes a seal rail or baffle 30 and a shroud surface 32. The seal rail or baffle 30 generally extends across the width of the turbine bucket 10. As a result, the baffle 30 forms a seal between the turbine bucket 10 and a casing or shell (not shown) to restrict the flow of combustion gases from bypassing the turbine bucket 10. The base of the baffle 30 may include a fillet 34 or concave curvature for connecting the baffle 30 to the shroud surface 32 to reduce stresses between the baffle 30 and the shroud surface 32.

As shown in FIG. 2, the shroud surface 32 generally includes multiple grain structures with associated multiple grain boundaries 36 produced from the casting of the turbine bucket 10. However, first and second bearing surfaces 38, 40 on opposite ends of the shroud surface 32 each comprise a single grain structure 42 distinct from the multiple grain boundaries 36 present in the remainder of the shroud surface 32. The first and second bearing surfaces 38, 40 may extend across the depth of the turbine bucket 10, or a portion thereof, and may comprise a z-notch 44 as shown in FIG. 2, but the present invention is not limited to any particular depth or shape for the first and second bearing surfaces 38, 40, unless specifically recited in the claims. The single grain structure 42 of the first and second bearing surfaces 38, 40 may have a thickness or width of 0.25 inches, 0.5 inches, 1 inch, or more. The single grain structure 42 present at that bearing surfaces 38, 40 provides enhanced resistance to fractures at the bearing surfaces 38, 40.

Figure 3:
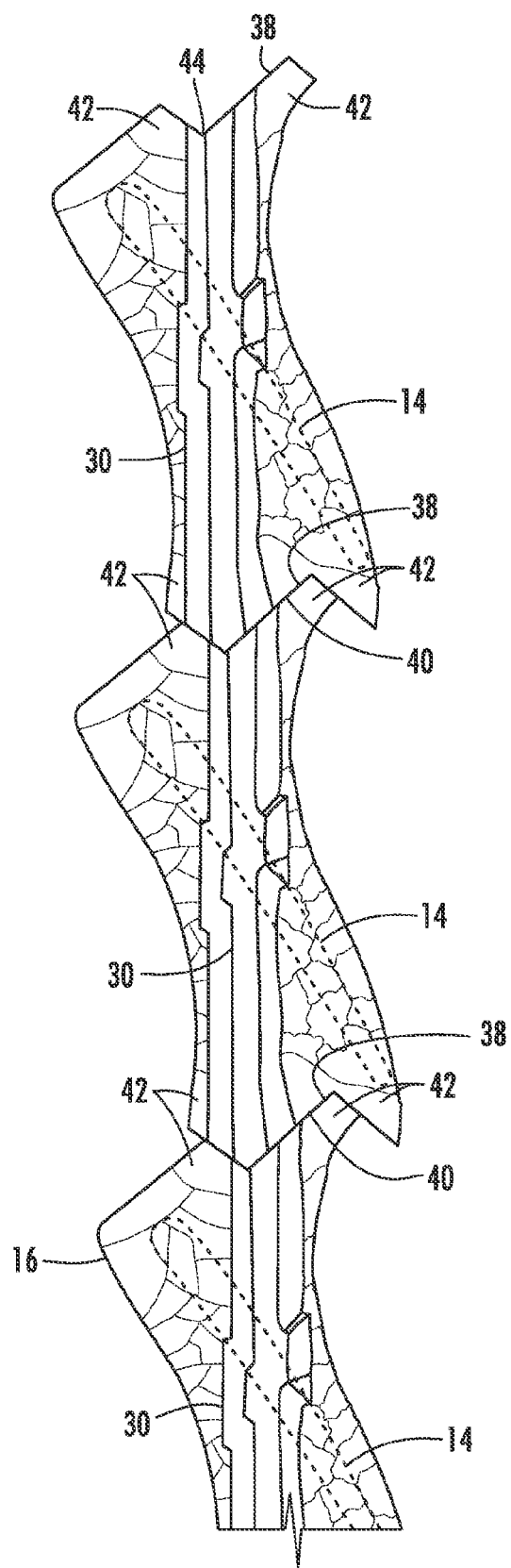
FIG. 3 is a top plan view of adjacent turbine buckets constructed according to one embodiment of the present invention.

As shown in FIG. 3, the first and second bearing surfaces 38, 40 engage with second and first bearing surfaces 40, 38 on adjacent turbine buckets 10. The engagement between adjacent turbine buckets 10 allows adjacent turbine buckets 10 to interlock at the outer radial extremity to reduce or prevent the turbine buckets 10 from vibrating, thereby reducing the stresses imparted on the turbine buckets 10 during operation. The single grain structure 42 at the first and second bearing surfaces 38, 40 may improve the wear and crack resistance of the turbine buckets 10 at the precise area where adjacent turbine buckets 10 engage one another. As a result, the interval between inspections and/or life expectancy of the shroud 16 may be extended, thereby reducing down time and/or maintenance costs.

Figure 4:
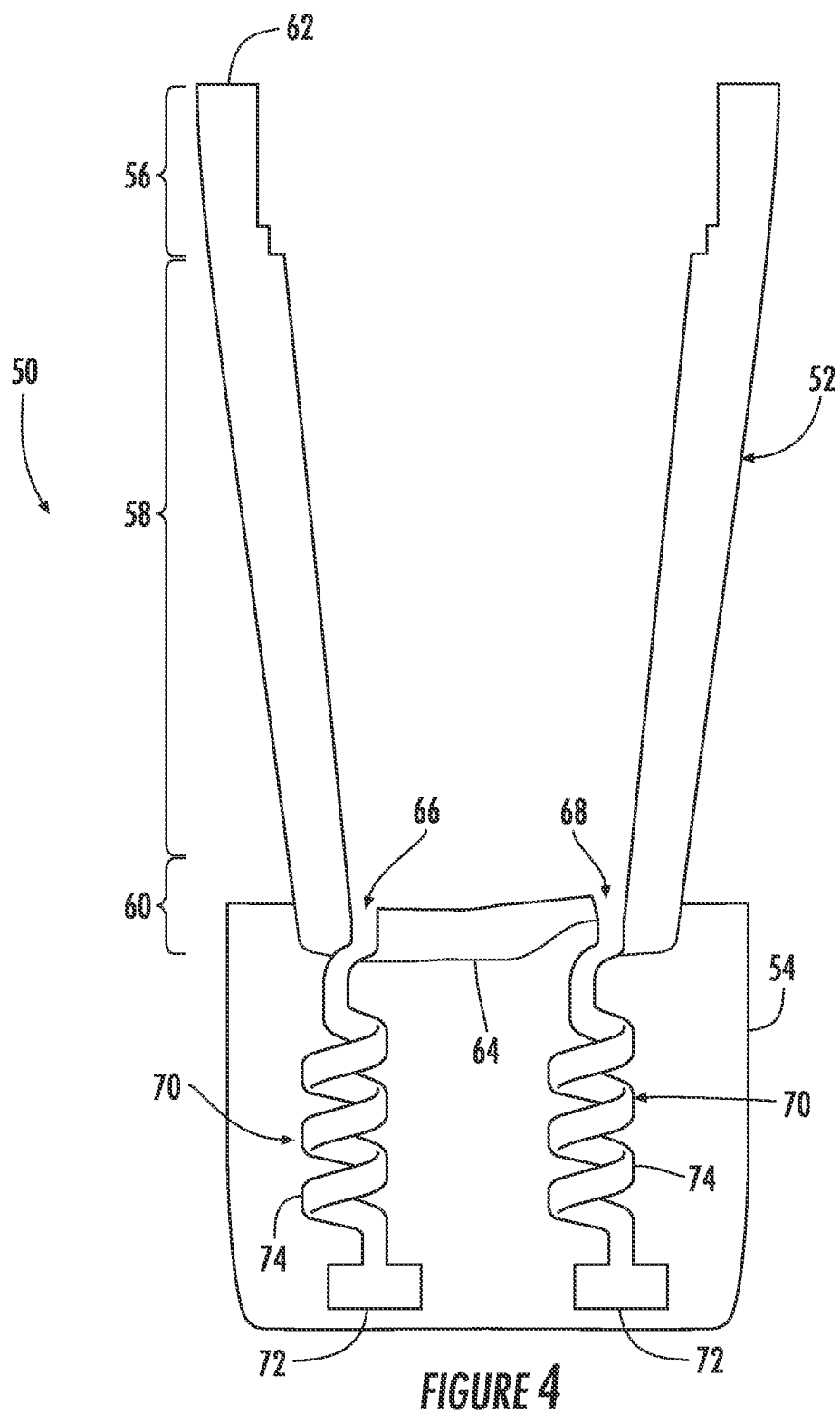
FIG. 4 is a system for casting a directionally solidified turbine bucket according to one embodiment of the present invention.

FIG. 4 illustrates an embodiment of a system 50 for casting the directionally solidified turbine bucket 10 previously described and illustrated in FIGS. 1-3. As shown, the system 50 generally includes a mold 52 and a chill plate 54. The mold 52 generally includes first 56, second 58, and third portions 60 that define the shank 12, airfoil 14, and shroud 16, respectively, of the turbine bucket 10. The first portion 56, at a first end 62 of the mold 52, connects to the second portion 58 in the middle of the mold 52, and the second portion 58 in turn connects to the third portion 60 at a second end 64 of the mold 52. As shown in FIG. 4, the mold is generally vertically oriented with the first portion 56 higher than the second portion 58 and the second portion 58 higher than the third portion 60. The chill plate 54 is typically located proximate the third portion 60 to rapidly remove heat and create a vertical temperature gradient along the mold 52. The vertical temperature gradient promotes the growth of directionally solidified grains normal to the chill plate 54 from the third portion 60, through the second portion 58, and ending at the first portion 56.

The third portion 60 of the mold 52 includes a first side 66 and a second side 68 which generally correspond to the location of the first and second bearing surfaces 38, 40 of the shroud 16. A single crystal selector 70 connects to at least one of the first side 66 or the second side 68 of the third portion 60. In particular embodiments, the single crystal selector 70 may connect to both the first side 66 and the second side 68 of the third portion 60. Various single crystal selectors are known in the art for growing single crystal structures. For example, the single crystal selector 70 may include a vertical or horizontal crucible of molten material exposed to a temperature gradient to produce a single crystal structure from a seed crystal using a technique referred to as the Bridgman technique. Other techniques known in the art for growing single crystal structures include electron beam floating zone techniques, RF floating zone techniques, epitaxial growth techniques, and levitation melting techniques.

As shown in FIG. 4, the single crystal selector 70 may comprise a starter chamber 72 connected to a tubular passage, such as a helix 74. The starter chamber 72 should be spaced from the chill plate 54 to permit a columnar crystal to grow into the tubular passage. The tubular passage forms a passageway between the starter chamber 72 and the first and/or second side 66, 68 of the third portion 60. As such, the tubular passage should provide a continuous uphill slope from the starter chamber 72 and include enough changes in direction to exclude all but the grain desired to continue through the first and/or second side 66, 68 of the third portion 60. In this manner, the single crystal selector 70 promotes a columnar growth of a single crystal from the starter chamber 72, through the helix 74, and into the third portion 60 of the mold 52, resulting in the single grain structure 42 previously described and illustrated with respected FIGS. 2 and 3.

The system illustrated in FIG. 4 may provide a method for forming a directionally solidified turbine bucket, such as the turbine bucket 10 previously described with respect to FIGS. 1-3. As shown in FIG. 4, the mold is generally oriented vertically so that the first portion 56 is higher than the second portion 58, and the second portion 58 is higher than the third portion 60. Molten metal may be flowed into the mold 52, and the single crystal selector 70 may be used to selectively grow large single grains in at least one of the first side 66 or second side 68 of the third portion 60. In particular embodiments, the single crystal selector 70 may be used to selectively grow large single grains in both the first side 66 and second side 68 of the third portion 60.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A turbine bucket comprising:
   a. an airfoil;
   b. a shroud at one end of the airfoil, wherein the shroud includes a shroud surface that extends between a first bearing surface and a second bearing surface, wherein a first portion of the shroud surface proximate to the first bearing surface comprises a single grain structure, a second portion of the shroud surface proximate to the second bearing surface comprises a single grain structure and a remaining portion of the shroud surface comprises a multi-grain structure.

2. The turbine bucket as in claim 1, wherein the first bearing surface extends across a dimension of the turbine bucket.

3. The turbine bucket as in claim 1, wherein the first bearing surface comprises a z-notch.

4. The turbine bucket as in claim 1, wherein the first bearing surface is opposite the second bearing surface.

5. The turbine bucket as in claim 1, further including a baffle that extends between the first and second bearing surfaces.

6. The turbine bucket as in claim 1, further including a baffle and a fillet connecting the baffle to the shroud surface.

7. The turbine bucket as in claim 1, wherein the single grain structure has a width of at least 0.5 inches.

8. The turbine bucket as in claim 1, wherein the single grain structure has a width of at least 1 inch.

* * * * *